United States Patent [19]
Lavochkin

[11] Patent Number: 5,570,271
[45] Date of Patent: Oct. 29, 1996

[54] HEAT SINK ASSEMBLIES

[75] Inventor: Ronald B. Lavochkin, Bow, N.H.

[73] Assignee: Aavid Engineering, Inc., Laconia, N.H.

[21] Appl. No.: 397,830

[22] Filed: Mar. 3, 1995

[51] Int. Cl.$^6$ ............................................. H05K 7/20
[52] U.S. Cl. ...................... 361/704; 165/185; 174/16.3; 257/719; 361/710
[58] Field of Search ........................ 165/80.2, 80.3, 165/185; 174/16.3; 248/510; 257/707, 718–719, 726–727; 280/149.2; 361/688, 695–697, 704, 707, 709–710, 720

[56] References Cited

U.S. PATENT DOCUMENTS

| | | | |
|---|---|---|---|
| 3,519,889 | 7/1970 | Monaco | 361/707 |
| 3,916,435 | 10/1975 | Camplin et al. | 257/726 |
| 4,345,267 | 8/1982 | Corman et al. | 361/710 |
| 5,331,507 | 7/1994 | Kyung et al. | 174/16.3 |
| 5,449,187 | 9/1995 | Schueman | 280/149.2 |
| 5,450,284 | 9/1995 | Wekell | 361/710 |

FOREIGN PATENT DOCUMENTS

| | | | |
|---|---|---|---|
| 2119250 | 5/1990 | Japan | 257/718 |
| 5191071 | 7/1993 | Japan | 361/720 |

*Primary Examiner*—Gregory D. Thompson
*Attorney, Agent, or Firm*—Fish & Richardson, P.C.

[57] ABSTRACT

A heat sink assembly made up of a heat sink, an electrical component adapted for mounting to a region of a printed circuit board mounted and, a clip. The clip includes a planar horizontal section, a pair of vertically extending legs disposed along folds formed at opposing ends of the horizontal section and, an engaging section disposed along an edge of the horizontal section and positioned intermediate the opposing ends of the horizontal section. The engaging section is adapted engage the heat sink and force the heat sink against the printed circuit board mounted electrical component as the legs of the clip engage the printed circuit board through holes formed in the printed circuit board on opposing sides of the component mounting region of the printed circuit board. A pair of gussets, is disposed at the folds formed at the opposing ends of the horizontal section. The gussets are provided to "lock in" the bend between the legs and the horizontal section at 90 degrees. The planar horizontal section, the pair of vertically extending legs, the gussets and the vertically extending, engaging section of the clip are a integrally formed from a single material, preferably sheet metal.

21 Claims, 6 Drawing Sheets

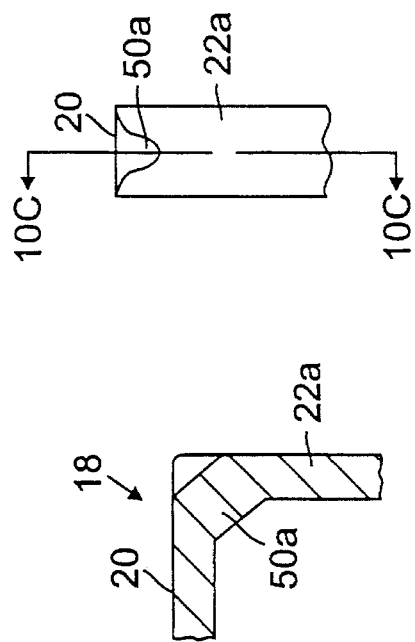
FIG. 10D
FIG. 10C
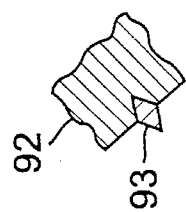
FIG. 10E
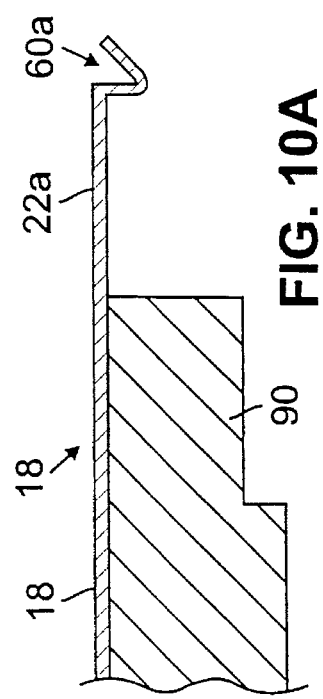
FIG. 10A
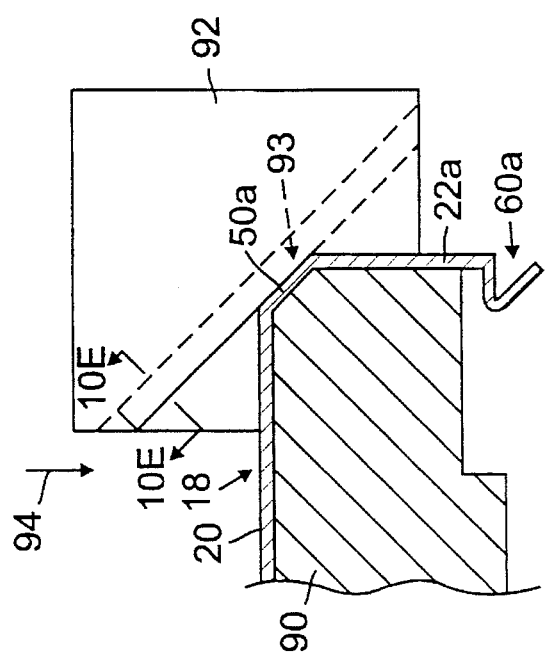
FIG. 10B

HEAT SINK ASSEMBLIES

BACKGROUND OF THE INVENTION

This invention relates generally to heat sink assemblies and more particularly to clips used to affix heat sinks to electronic components.

As is known in the art, heat sinks are used in a wide variety of applications, as for example, to remove heat from electronic components. Typically, when the electronic component is a digital component, such as a microprocessor, the component is mounted to a printed circuit board, as for example using ball grid array (BGA) or pin grid array (PGA) technology. The heat sink in mounted in thermal contact with an upper surface of the electronic component. The heat sink generally includes a thermal conductive metal, such as aluminum, formed as a single unit with a plurality of radiating fins or surfaces projecting from a base. The base is held against a surface of the electronic component, either directly, or through an intermediate, thermally conductive interface. A clip, or retainer is typically used to engage the base, or the interface, and force it against the upper surface of the component to thereby ensure a good thermally conductive path between the electronic component and the heat sink. The clip and the heat sink thereby provide a heat sink assembly.

In one form, the clips include cantilever members which deflected upon engagement with the base of the heat sink to provide desired forces. More particularly, one such clip is somewhat M-shaped; the V-shaped portion thereof bridging the pair of legs of the M-shaped clip. The V-shaped portion includes a central, horizontal section with a pair of upwardly sloping sections at the ends of the horizontal section. First ends of the sloping sections join with the ends of the horizontal section. Second ends of the sloping sections join with the pair of legs. These clips are typically fabricated as a planar strip of sheet metal having a proper outline so that, when folded, provide the M-shaped form. Thus, four folds are typically required: Two folds are used to provide the legs (i.e., the folds joining the legs and the second ends of the sloping section) and another pair of folds are used to provide joining of the first ends of the pair of sloping sections and the horizontal section. In order to form these folds in sheet metal, it is necessary to fold the sheet metal beyond its elastic range into its plastic range to obtain a permanent bend, or deformation, in the part. However, because of the characteristics of sheet metal, after it is bent there is a tendency for the material to want to bend, or "spring back" towards its original shape. This tendency is particularly characteristic of shallow, or gently sloping bend, such as bends less than 90 degrees. Thus, this tendency must be compensated for in the bending process, such as by over bending. The distal ends of the legs are dimensioned so that they pass through holes formed in the printed circuit board. The distal ends of the legs are provided with lips to engage underlying surface portions of the printed circuit board forming the peripheral region of the holes. Thus, considering the typical case where the electronic component is mounted to the upper surface of the printed circuit board, a pair of holes is provided through the printed circuit board on opposite sides of the region of the board being occupied by the electronic component. The M-shaped clip is held above the electronic component. As the legs are passed, downwardly, through the holes straddling opposing sides of the component, the horizontal section of the V-shaped portion bridging the legs engages the upper surface of the base of the heat sink. The legs of the clip are forced though the holes overcoming the upward force provided by the surface of the component against the horizontal section of the V-shaped portion (more particularly, by the deflection forces produced by the spring-like, cantilever sloping section) until the lips at the distal ends of the legs engage the bottom portions of the printed circuit board disposed about the holes and thereby the clip locks the base of the heat sink to the upper surface of the electronic component.

While such arrangement may provide an adequate arrangement where the printed circuit board had relatively large holes, as components became more closely packed on the surface of the board, the size and placement of the holes became more precisely defined. Further, the holes sometimes even became obscured. The use of precisely positioned, small holes, placed severe demands on the tolerances required in the manufacture of these clips. The "spring back" effect, plus subsequent operation, make it almost impossible for the clip to hold the desired dimensions. This tendency is particularly characteristic of shallow, or gently sloping bends, such as bends less than 90 degrees. The legs lose their precise vertical orientation requirement and therefore it is difficult to locate them in the holes, particularly where the holes are obscured. Thus, the legs must be maintained in a vertical orientation. Further, because the shape of the clip is not precisely maintained because of these "spring back" forces, the clamping force to be provided by the clip is also adversely effected; for example, the legs may deform if the non-vertical legs are bent together so that they may pass through the holes. This bending together of the legs will result in an upward force on the center section, thereby relaxing the clamping force on the base from the desired value. The clip no longer has a precisely controlled clamping force. Further in this regard, the distance between the horizontal section and the lips used to engage the bottom of the printed circuit board is critical to the amount of force which the clip will provide to the base of the heat sink and the electrical component. Thus, the folding process used to provide the four folds (i.e., and hence provide the cantilever members) must be made such that the legs will pass with proper vertical alignment through the holes and the V-shaped portion made to provide proper engaging force on the upper surface of the base of the heat sink to thereby obtain the requisite thermal conductivity between the component and the heat sink.

SUMMARY OF THE INVENTION

It is therefore an object of the invention to provide an improved heat sink assembly.

This and other objects of the invention are attained generally by providing a heat sink assembly, comprising: a heat sink, printed circuit board mounted electrical component and a clip. The clip comprises: a planar horizontal section; a pair of vertically expending legs disposed at opposing ends of the horizontal section; and an engaging section adapted to force the heat sink against the printed circuit board to mounted electrical component. The clip being formed as a single unit, preferably of sheet metal. The legs join the horizontal section at bends formed in the material at the opposing ends of the horizontal section. The bends have gussets, or stiffening ribs, disposed between the opposing ends of the horizontal section and the legs. Distal ends of the legs are shaped to engage holes formed in the printed circuit board on opposing sides of the region where the electrical component is mounted. The engaging section is adapted to contact the surface of the heat sink with the distal ends of the legs engaging the printed circuit board and thereby force the heat sink against the electrical component.

In one embodiment of the invention the engaging section is a standoff section extends substantially vertical from the horizontal member along the same direction as the legs. In a second embodiment the engaging section is a pair of horizontally extending tabs adapted for insertion into slots formed in the heat sink.

BRIEF DESCRIPTION OF THE DRAWINGS

For a more complete understanding of the concepts of the invention, reference is now made to the following drawing, in which:

FIGS. 10A through 10E are useful in understanding the method used to form the gussets, FIG. 10C being a cross sectional view of one of a pair of gussets used in the clip, such cross section being taken along line 10C—10C of FIG. 10D, and FIG. 10E being a cross section of a diamond shaped insert used in a punch to form each one of the gussets, such cross section being taken along line 10E—10E in FIG. 10B;

DESCRIPTION OF THE PREFERRED EMBODIMENTS

Figure 1:
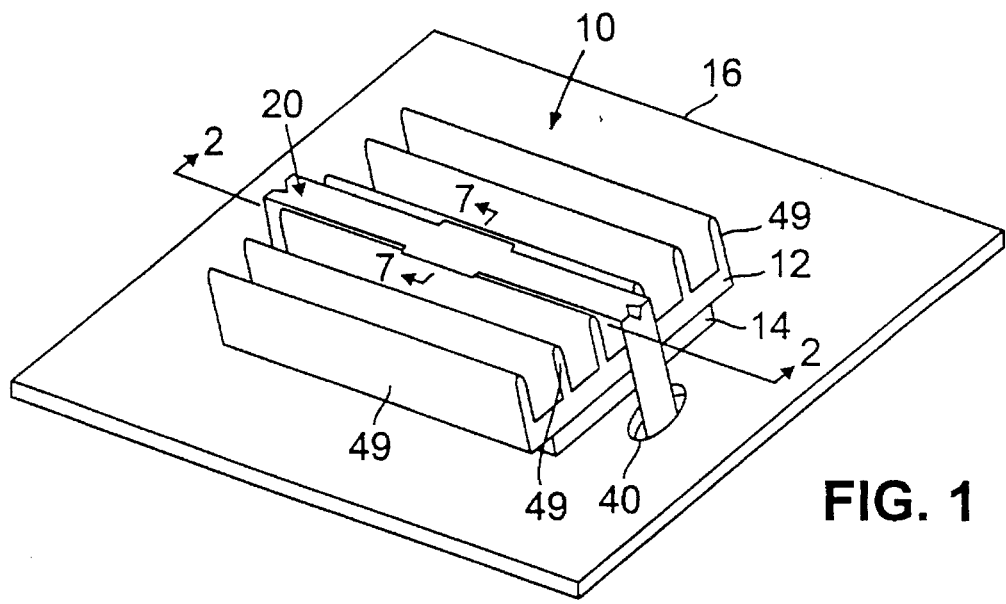
FIG. 1 is an isometric sketch of a heat sink assembly according to the invention.
Figure 2:
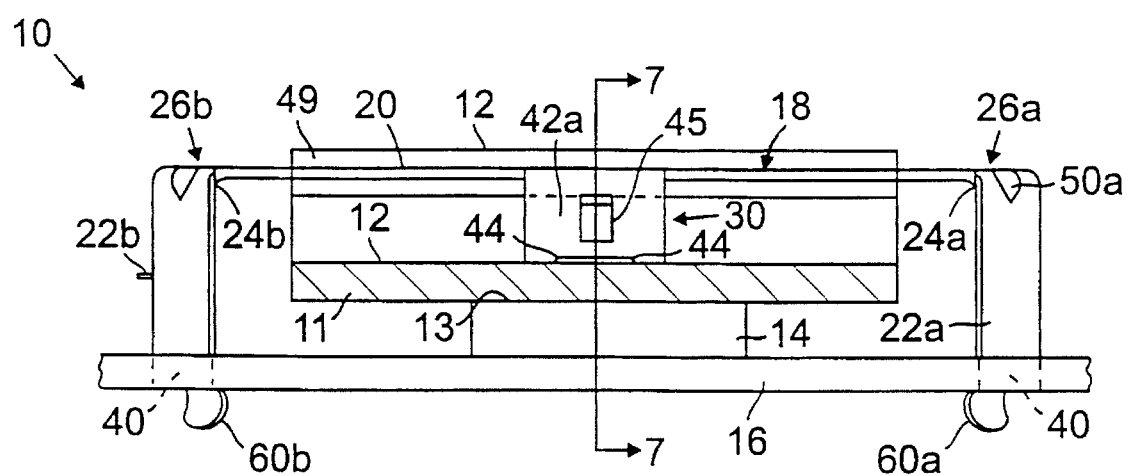
FIG. 2 is an elevation cross sectional view of the heat sink assembly of FIG. 1, such cross section being taken along line 2—2 of FIG. 1.
Figure 3:
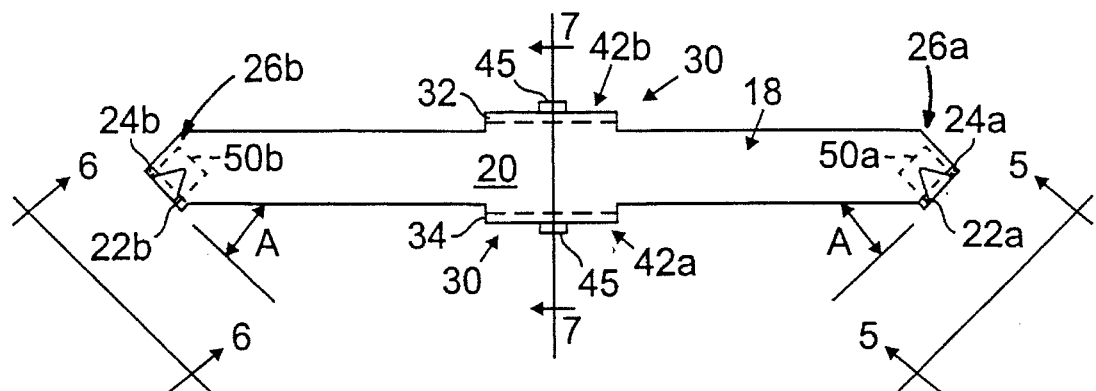
FIG. 3 is a top view of a clip used in the heat sink assembly of FIGS. 1 and 2.
Figure 4:
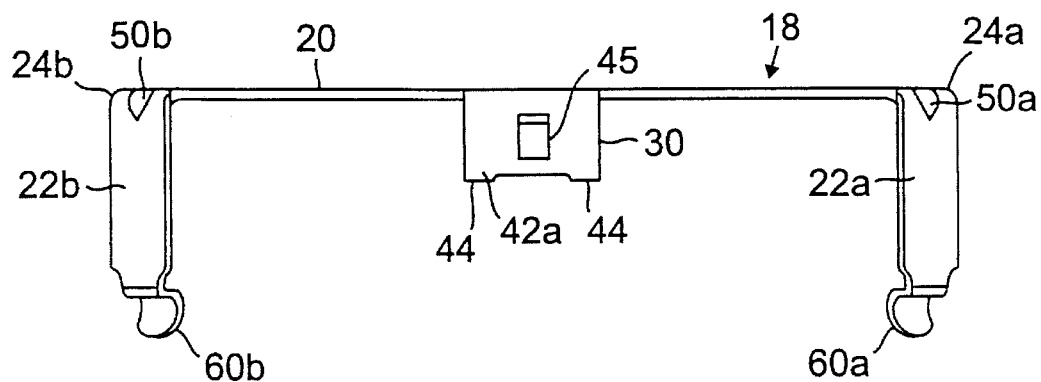
FIG. 4 is an elevation view of the clip of FIG. 3.
Figure 5:
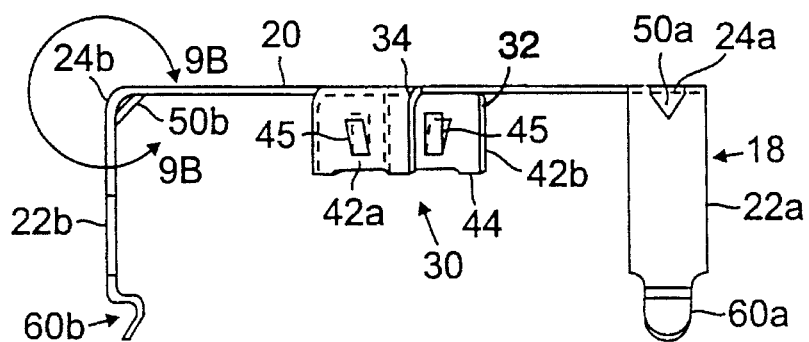
FIG. 5 is an elevation view of the clip of FIGS. 3 and 4, such view being taken along line 5—5 in FIG. 3.
Figure 6:
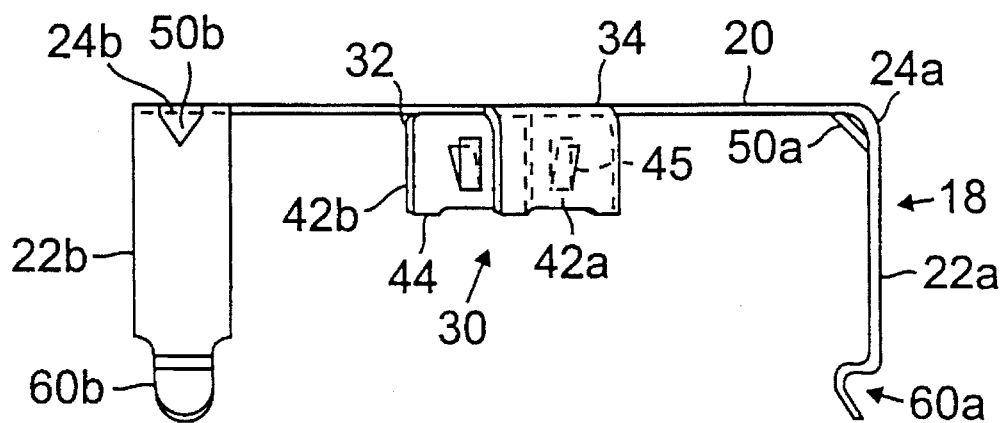
FIG. 6 is an elevation view of the clip of FIGS. 3 and 4, such view being taken along line 6—6 in FIG. 3.
Figure 7:
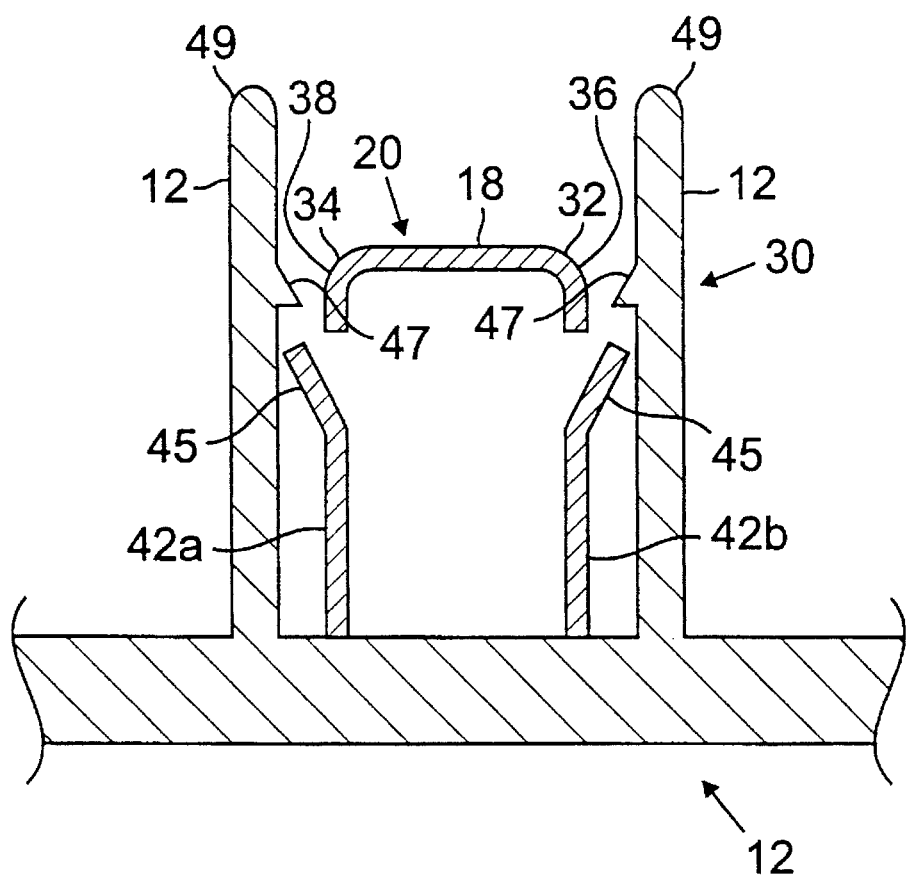
FIG. 7 is a cross sectional view of a portion of the clip of FIG. 3, such cross section being taken along line 7—7 of FIG. 2.

Referring now to FIGS. 1 and 2, a heat sink assembly 10 is shown. Such heat sink assembly 10 includes a heat sink 12, an electrical component 14 adapted for mounting to a region of a printed circuit board 16 and, a clip 18. An thermally conductive interface, not shown, may be interposed between the base 11 of the heat sink 12 and the upper, engaging surface 13 of the electrical component 14. The clip 18, shown more clearly in FIGS. 3 through 7, includes a planar, here elongated, horizontal section 20, a pair of vertically extending legs 22a, 22b disposed along folds 24a, 24b, respectively, formed at opposing ends 26a, 26b, respectively, of the horizontal section 20. Thus, preferably, the horizontal section 20 is at a 90 degree angle with respect to each of the vertically extending legs 22a, 22b. However, the angle between the horizontal section 20 and each of the vertically extending legs 22a, 22b may be in a range from 60 degrees to 120 degrees. An engaging section 30, here a vertically extending, platform, or standoff section, also shown in cross section in FIG. 7) is disposed along folds 32, 34 formed on opposing portions of edges 36, 38 of the horizontal section 20 and positioned intermediate the opposing ends 26a, 26b of the horizontal section 20. While preferably the angle between the standoff engaging section 30 and the horizontal section 20 is preferably 90 degrees, the angle may be in a range from 60 degrees to 120 degrees. Here, the length of each of the opposing folds 24a, 24b is disposed at a 45 degree angle, A, (FIG. 3) with respect to the longitudinal axis of the horizontal section 20; however, alternatively, the length of each of the folds 24a, 24b may be at any orientation, such as 90 degree angle with respect to the longitudinal axis of the horizontal section 20.

The standoff engaging section 30 is adapted to engage the heat sink 12 and force the heat sink 12 against the printed circuit board mounted electrical component 14 as the legs 22a, 22b of the clip 18 engage the bottom surface portions of the printed circuit board 16 through holes 40 formed in the printed circuit board 16 on opposing sides of the electrical component 14 mounting region of the printed circuit board 16. (See FIGS. 8A, 8B for an exemplary one of the legs 22a, 22b, here leg 22a). As shown in FIGS. 1 through 7, the standoff engaging section 30 includes a pair of vertically extending standoff members 42a, 42b disposed one behind the other and projecting downwardly from the horizontal section 20, as shown particularly in FIGS. 3 and 4. The height of the standoff members 42a, 42b is selected in accordance with the desired range of forces to be exerted by the clip 18 when affixed to the printed circuit board 16 and when engaging the heat sink 12. The dimensions of the clip 18 may be designed using conventional flat spring design rules as for example, those set out in Table 18, page 547 of "Machinery Handbook", Twentieth Edition, published by the International Press, copyright 1978. The thickness of the material used for the clip 18 is dependent upon the particular application; here, however, the thickness is in the range 0.012" to 0.040". The thickness is selected in accordance with spring characteristics trying to achieve in accordance with geometry and using standard flat spring design curves and equations such as those presented in the Table referred to above. Here, the dimensions for a particular clip 18, here after heat treating a 1075 series steel sheet are: the span between legs 22a, 22b is here 2.116 inches; the standoff engaging section 30 height is 0.2 inches; the width of the horizontal section 20 and legs 22a, 22b is 0.187 inches, and the thickness of section 20 and legs 22a, 22b is 0.022 inches; the overall length of the legs 22a, 22b is 0.642 inches after forming locking tabs 60a, 60b (FIGS. 2, 4 through 8A, 8B), to be described in more detail hereinafter, at the distal ends thereof. The length of each standoff member 42a, 42b is here 0.34 inches, however, the length is selected from mechanical stability considerations. Here, the distal edge of each standoff member 42a, 42b is provide with a pair of feet 44, here 0.012 inches in height and 0.08 inches in length. The feet 44 provide good gripping action on the component 14 by digging slightly into the outer case of component 12. The outer surface of the side wall of each standoff engaging section 40 is provided with a ledge 45, as shown in cross section in FIG. 7 to engage protrusions 47 formed on the inner surfaces of cooling fins 49 of heat sink 12. It should be noted that other materials may be used, for example, 400 series stainless steel may be used for clip 18.

Figure 9A:
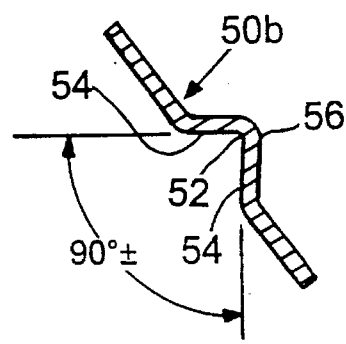
FIG. 9A shows a cross section of one of a pair of gussets used in the clip of FIGS. 3–6, such cross section being taken along line 9A—9A of FIG. 9B.
Figure 9B:
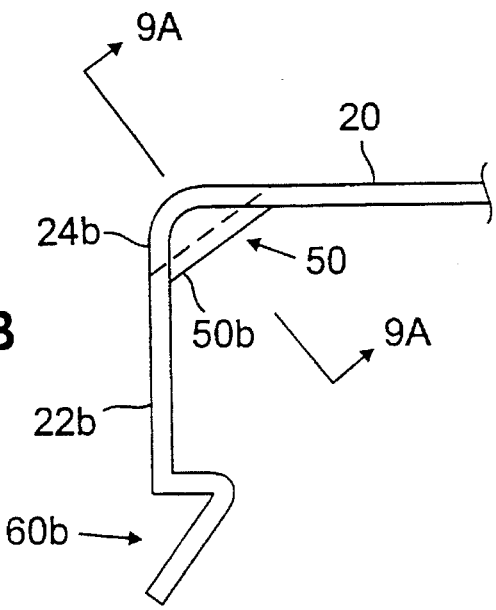
FIG. 9B being an enlarged view of the area 9B-(b in FIG. 5.

The clip 18 includes a pair of gussets 50a, 50b, each one of the gussets 50a, 50b being disposed at a one of the folds 24a, 24b, respectively, as shown particularly in FIGS. 5, 6, 9A and 9B (i.e., formed at the opposing ends 26a, 26b, respectively of the horizontal section 20). Thus, the gussets 50a, 50b extend between the distal ends of the horizontal section 20 and the proximal ends of the pair of vertically extending legs 22a, 22b, respectively, as shown. The planar horizontal section 20, the pair of vertically extending legs 22a, 22b, the vertically extending, standoff engaging section 30, and the pair of gussets 50a, 50b of the clip 18 are a integrally formed from a single material, preferably sheet metal, as noted above. Each gusset 50a, 50b is formed, here with a groove 52 having a radius of 0.01 inches terminating in side walls 54 having a 90 degree angle therebetween, as shown in FIG. 9B for gusset 50a. Here, the depth of the groove 52 at its apex 56 is 0.06 inches.

Figure 8A:
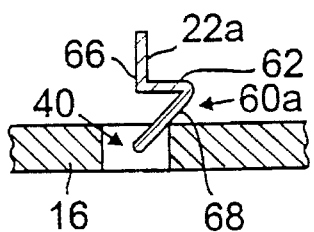
FIGS. 8A, 8B are cross sectional views of a one of a pair of locking tab of the clip of FIGS. 3–6, FIG. 8A showing the tab as it engages a hole formed in a printed circuit board, and FIG. 8b showing the tab after it has passed through the hole to lock the heat sink assembly to the printed circuit board.
Figure 8B:
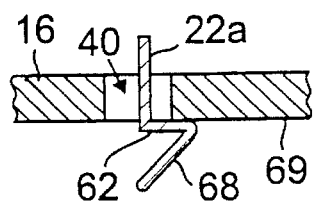

Distal ends of the legs 22a, 22b are provided with locking tabs 60a, 60b, respectively. The locking tabs 60a, 60b are shaped to pass into the holes 40 formed in the printed circuit board 16 and are formed with surfaces configured to lock the clip 18 to the heat sink 12 with the distal ends of the legs 22a, 22b engaging the printed circuit board 16 and thereby force the heat sink 12 against the electrical component 14. Here, each one of the locking tabs 60 has a horizontal shoulder section 62 projecting inwardly towards the region of the clip 18 between the legs 22a, 22b. The shoulder section 62 is formed, at one end thereof, from a fold 66 formed in the distal end region of the legs 22a, 22b, as shown more clearly in FIGS. 8A and 8B, for locking tab 60a. The shoulder section 62 terminates at the other end thereof into a sloping section 68, as shown. Here, the sloping section 68 is, here, at a 27 degree angle with respect to the vertical axis, as shown. Here, the length of the horizontal shoulder section 62 is 0.98 inches. As shown, the outer width of the locking tabs 60a, 60b is here, 0.115 inches and is centrally disposed with respect to the central, vertical axis of the leg 22a, 22b. Referring to FIG. 8A, the sloping section engages the walls of the hole 40 and urges the leg 22a slightly inwardly allowing the shoulder section 62 to pass through the hole 40. Once clear of the hole 40, the shoulder section 62 snaps outwardly and the upper surface of the shoulder section 62 is engages the lower surface portion 69 of printed circuit board 16, as shown in FIG. 8B.

Referring now to FIGS. 10A through 10D, the process used to form an exemplary one of the gussets 50a, 50b, here gusset 50a, will be discussed. After the locking tabs 60a, 60b are formed in any conventional manner, using conventional progressive stamping die equipment, the clip 18 is rested on a stationary die 90, as shown in FIG. 10A. A punch 92, having a diamond shaped insert 93 (FIG. 10E) is forced downwardly in the direction of arrow 94 to form a 90 degree bend between the horizontal section 20 and the leg 22a, as shown in FIG. 10B and to form an indentation; i.e., the gusset 50a (FIG. 10D).

Figure 11:
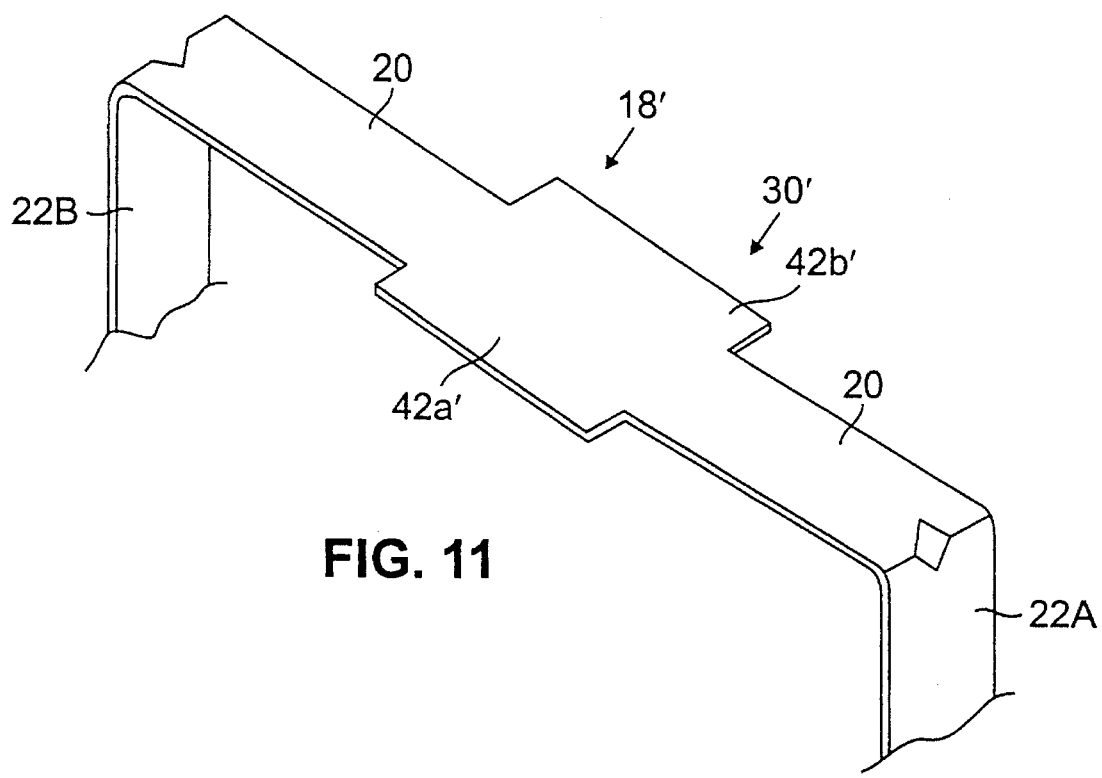
FIG. 11 is an isometric sketch of a portion of a clip adapted for use in a heat sink assembly according to an alternative embodiment of the invention.
Figure 12:
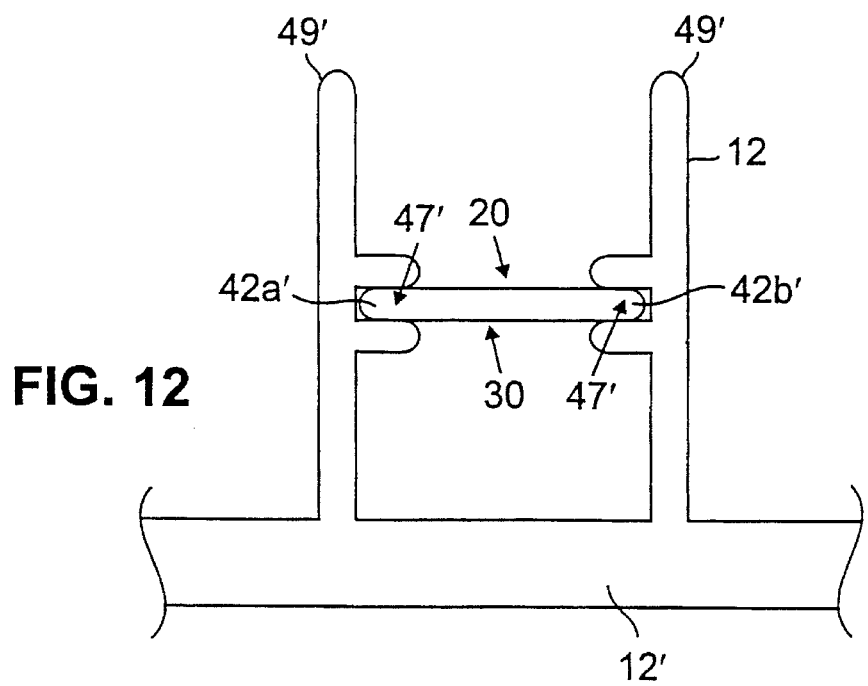
FIG. 12 is a cross sectional view of a portion of the clip of FIG. 11 engaging a portion of a heat sink.

Referring now to FIGS. 11 and 12 an alternative clip 18' having engaging section 30' is shown. Here, the engaging section 30' includes a pair of tabs 42'a, 42'b extending horizontally from edges of the horizontal member 20 intermediate the vertically extending legs 22a, 22b, as shown. The tabs 42'a 42'b horizontal section 20, and legs 22a, 22b are all formed of a single material, such as described above in connection with clip 18. The tabs 42'a, 42'b are adapted to be inserted into slots 43'a, 43'b formed in the cooling fins 49' of heat sink 12', as shown in FIG 12.

Other embodiments are within the spirit and scope of the appended claims.

What is claimed is:

1. A heat sink assembly, for use with an electrical component adapted for mounting to a region of a printed circuit board, comprising:

a heat sink; and, a clip, such clip comprising:

a planar horizontal section;

a pair of substantially vertical extending legs disposed along folds formed at opposing ends of the horizontal section;

an engaging section disposed along a portion of an edge of the horizontal section and positioned between the opposing ends of the horizontal section, such engaging section being adapted engage the heat sink and force the heat sink against the printed circuit board mounted electrical component as the legs of the clip engage the printed circuit board through holes formed in the printed circuit board on opposing sides of the component mounting region of the printed circuit board;

a pair of gussets, each one of the gussets being disposed at one of the folds formed at the opposing ends of the horizontal section, such gussets extending between the horizontal section and the pair of substantially vertical extending legs; and wherein the planar horizontal section, the pair of substantially vertical extending legs, the engaging section, and the pair of gussets of the clip are a single, integral unit having a common material.

2. The assembly recited in claim 1 wherein the material is sheet metal.

3. A heat sink assembly for use with an electrical component adapted for mounting to a region of a printed circuit board, comprising:

a heat sink; and, a clip, for engaging the heat sink, such clip comprising:

a pair of substantially vertical extending legs;

an intermediate section disposed between the legs along folds formed at opposing ends of such intermediate section; and, a pair of gussets, each one of the gussets being disposed at a one of the folds formed at the opposing ends of the intermediate, such gussets extending between the intermediate section and the pair of substantially vertical extending legs; and wherein the intermediate section, the pair of substantial vertical extending legs and the pair of gussets of the clip are a single, integral unit having a common material.

4. The assembly recited in claim 3 wherein the material is sheet metal.

5. The assembly recited in claim 3 wherein distal ends of the legs are shaped to pass into the holes formed in the printed circuit board and are adapted to lock the clip to the heat sink with the distal ends of the legs engaging the printed circuit board and thereby force the heat sink against the electrical component.

6. A clip adapted for use with a heat sink, such clip comprising:

a pair of substantially vertical extending legs;

an intermediate section disposed between the legs along folds formed at opposing ends of such intermediate section and adapted to engage a surface of the heat sink; and, a pair of gussets, each one of the gussets being disposed at one of the folds formed at the opposing ends of the intermediate, such gussets extending between the intermediate section and the pair of substantially vertical extending legs; and wherein the intermediate section, the pair of substantially vertical extending legs and the gussets of the clip are a single, integral unit having a common material.

7. The clip recited in claim 6 including an engaging section disposed along an edge of the intermediate section and positioned between the opposing ends of the intermediate, such engaging section being adapted engage the heat sink.

8. The clip recited in claim 7 wherein the intermediate section, the pair of substantially vertical extending legs, the engaging section, and the gussets of the clip are a single, integral unit having a common material.

9. The clip recited in claim 8 wherein distal ends of the legs are shaped to pass into the holes formed in a printed circuit board and are adapted to lock the clip to the heat sink with the distal ends of the legs engaging the printed circuit board and thereby force the heat sink against the electrical component.

10. A heat sink assembly, for use with an electrical component adapted for mounting to a region of a printed circuit board, comprising:

a heat sink: and, a clip, such clip comprising:

a planar horizontal section;

a pair of substantially vertical extending legs disposed along folds formed at opposing ends of the horizontal section;

an engaging section disposed along a portion of an edge of the horizontal section and positioned between the opposing ends of the horizontal sections such engaging section being adapted engage the heat sink and force the heat sink against the printed circuit board mounted electrical component as the legs of the clip engage the printed circuit board through holes formed in the printed circuit board on opposing sides of the component mounting region of the printed circuit board; and wherein the heat sink has a slot and wherein the engaging section includes a tab extending horizontally from the horizontal section and is adapted for insertion into the slot.

11. The heat sink assembly recited in claim 10 wherein the engaging section includes feet.

12. A heat sink assembly, for use with an electrical component adapted for mountinq to a region of a printed circuit board, comprising:

a heat sink; and, a clip, such clip comprising:

a planar horizontal section;

a pair of substantially vertical extending legs disposed along folds formed at opposing ends of the horizontal section;

an engaging section disposed along a portion of an edge of the horizontal section and positioned between the opposing ends of the horizontal section, such engaging section being adapted engage the heat sink and force the heat sink against the printed circuit board mounted electrical component as the legs of the clip engage the printed circuit board through holes formed in the printed circuit board on opposing sides of the component mounting region of the printed circuit board;

a pair of gussets, each one of the gussets being disposed at one of the folds formed at the opposing ends of the horizontal section, such gussets extending between the horizontal section and the pair of substantially vertical extending legs; and wherein the heat sink has a slot and wherein the engaging section includes a tab extending horizontally from the horizontal section and is adapted for insertion into the slot.

13. The clip recited in claim 12 wherein the engaging section includes feet.

14. A clip, such clip comprising:

a planar horizontal section;

a pair of substantially vertical extending legs disposed along folds formed at opposing ends of the horizontal section;

an engaging section disposed along a portion of an edge of the horizontal section and positioned between the opposing ends of the horizontal section, such engaging section being adapted engage the heat sink; and wherein the engaging section includes a tab extending horizontally from the horizontal section.

15. The clip recited in claim 14 wherein the engaging section includes feet.

16. A clip, such clip comprising:

a planar horizontal section;

a pair of substantially vertical extending legs disposed along folds formed at opposing ends of the horizontal section;

an engaging section disposed along a portion of an edge of the horizontal section and positioned between the opposing ends of the horizontal section, such engaging section being adapted to exert a force on the heat sink; and wherein the engaging section includes a tab extending horizontally from the horizontal section.

17. The clip recited in claim 16 wherein the engaging section includes feet disposed along an edge of the engaging section.

18. A clip, such clip comprising:

a pair of substantially vertical extending legs;

an intermediate section disposed between the legs along folds formed at opposite ends of such intermediate section and adapted to exert a force on an electrical component;

an engaging section disposed along a portion of an edge of the horizontal section and positioned between the opposing ends of the horizontal section, such engaging section being adapted engage the heat sink and force the heat sink against the printed circuit board mounted electrical component as the legs of the clip engage the printed circuit board through holes formed in the printed circuit board on opposing sides of the component mounting region of the printed circuit board;

a pair of gussets, each one of the gussets being disposed at one of the folds formed at the opposing ends of the horizontal section, such gussets extending between the horizontal section and the pair of substantially vertical extending legs; and wherein the engaging section includes a tab extending horizontally from the horizontal section.

19. A clip adapted for use with a heat sink, such clip comprising:

a pair of substantially vertical extending legs;

an intermediate section disposed between the legs along folds formed at opposing ends of such intermediate section; and, an engaging section disposed along a portion of an edge of the horizontal section and positioned between the opposing ends of the horizontal section, such engaging section being adapted engage the heat sink, such engaging section including a ledge extending from the horizontal engaging section.

20. The clip recited in claim 19 wherein the ledge is configured to engage the heat sink.

21. The clip recited in claim 20 including a pair of gussets, each one of the gussets being disposed at one of the folds formed at the opposing ends of the horizontal section, such gussets extending between the horizontal section and the pair of substantially vertical extending legs.

* * * * *